United States Patent [19]
Hinrichs et al.

[11] Patent Number: 5,453,682
[45] Date of Patent: Sep. 26, 1995

[54] WIDE-RANGE THERMISTOR METER

[75] Inventors: Karl Hinrichs, Westminster; Abdollah Mohtashemi, Laguna Niguel, both of Calif.

[73] Assignee: Newport Electronics, Inc., Santa Ana, Calif.

[21] Appl. No.: 188,076

[22] Filed: Jan. 27, 1994

[51] Int. Cl.$^6$ .............................. G01R 19/22; G01R 1/30
[52] U.S. Cl. ...................... 324/132; 324/119; 324/130; 374/171
[58] Field of Search .................................. 324/105, 130, 324/132; 374/171, 172, 183, 184, 185, 128; 364/571

[56] References Cited
U.S. PATENT DOCUMENTS 4,513,245  4/1985  Yokoyama .............................. 324/119

*Primary Examiner*—Kenneth A. Wieder
*Assistant Examiner*—Barry C. Bowser
*Attorney, Agent, or Firm*—Bruce E. Hosmer; Howard S. Reiter

[57] ABSTRACT

A meter measures a voltage across a quasi-diode, the voltage caused by a current flowing through a resistance which changes substantially exponentially with changes in a medium being sensed. The meter comprises a logarithmic current measuring circuit coupled to the resistance to provide a measurement output that is a logarithmic function of the current flowing through the sensing resistance. A switchable current source is controlled by a switching circuit to repetitively output first and second current values. A reference logarithmic circuit is connected to the switchable current source and is physically coupled to the logarithmic measuring circuit so as to be maintained at a substantially equal temperature value. The logarithmic reference circuit manifests a first voltage in response to the first current value and a second voltage in response to the second current value, both voltage values dependent upon the temperature of the logarithmic reference circuit. A processor controls the switchable current source to operate at a repetition rate which assures that the first and second current values occur sufficiently rapidly so that the first and second voltages are manifest before the temperature value has had an opportunity to substantially vary. The processor derives from the first voltage, second voltage, and the measuring circuit output, a corrected output that eliminates meter temperature affects.

7 Claims, 2 Drawing Sheets

WIDE-RANGE THERMISTOR METER

FIELD OF THE INVENTION

This invention relates to meters for automated measurement of temperature using a temperature-sensitive resistance sensor and, more particularly, to a meter that is adapted to accommodate wide variations of sensor resistance values.

BACKGROUND OF THE INVENTION

Thermistors, which are ceramic resistors sintered from mixtures of metal oxides, typically have 20 times the temperature sensitivity, one tenth the cost, and twenty times the resistance of purely metallic resistance-sensing elements. High thermistor resistance values allow simple two wire connections to a measurement instrument without concern about variations in lead resistance.

Over a typical thermistor range of −80 to + 150 degrees Celsius, a thermistor can have excellent conformance to published curves and further exhibit repeatability that approaches that of metallic resistance elements. However, as is known, a thermistor's curve of resistance-versus-temperature is much more nonlinear than that of a metallic resistance element. Therefore, thermistors require a meter with linearizing capabilities.

The equation that closely matches a thermistor/temperature response curve is the Steinhart-Hart equation:

$$1/T = A + B*\ln(R) + C*[\ln(R)]^3 \qquad (1)$$

where A, B, and C are selected to match a particular thermistor type. At higher temperatures, the Steinhart-Hart equation also includes a $[\ln(R)]^2$ term. The "B" term in equation 1 is by far the dominant variant term for most thermistors.

To convert thermistor resistance values to accurate thermistor temperature indications over the full useful temperature range, a typical meter must utilize means to compress the typical 40,000:1 thermistor resistance span into a high accuracy/high resolution input span capable of being handled by a meter, typically 10:1. The prior art has employed a number of techniques to accomplish or avoid span compression.

Certain meters have added resistors whose values are chosen to enable sensing of a particular temperature span. Those resistors place the thermistor in a bridge configuration and enable the meter to appropriately sense chosen middle values, while causing the meter to lose sensitivity at temperature extremes. Other meters have employed a pair of matched thermistors to obtain an almost linear differential signal for a restricted temperature range. Still others have switched the thermistor drive current (either up or down manually or by autoranging) until the thermistor signal is within the meter's accurate range. Finally, a meter's input voltage scale can be switched, either manually or by autoranging an input voltage divider, so as to enable the input voltage to be within the meter's accurate range.

The above described techniques cause one or more of the following: limit the measurement range; limit the speed of response of the meter; significantly raise sensor and/or meter costs; or result in high voltages or high currents with concomitant sensor heating effects and reduced accuracies.

It has been further realized in the prior art, that because the resistance of a thermistor varies exponentially with thermistor temperature, that a logarithmic detector will provide compensation for both the exponential characteristic and the wide variation in thermistor resistance values. In this regard, it has been proposed that a diode-like semiconductor be employed as the logarithmic detector, with the diode-like semiconductor provided by a bipolar transistor whose collector is connected to its base electrode to create a "quasi-diode". The collector voltage of a quasi-diode is given, to high accuracy, by the Arrhenius equation (with ohmic drop added) as follows:

$$Vm = (kTm/q)*(\ln[I] - \ln[Irs]) + I*Rq \qquad (2)$$

where:

Tm is the absolute temperature of the quasi-diode junction in kelvins k is Boltzmann's constant;

q is the electronic charge;

I is the current flowing through the thermistor;

Irs is the reverse-saturation current of the bipolar transistor; and

Rq is the ohmic resistance of the bipolar transistor.

The logarithmic relationship of equation 2 translates current in the nanoampere-to-milliampere range to a 200- to-700 millivolt range for a typical meter temperature environment. This useful translation however, has not been used in the prior art because of the large effects of meter temperature on the quasi-diode voltage, particularly as a result of the nearly-exponential increase in reverse saturation current of the diode with meter temperature.

A theoretical reverse-saturation current of a transistor, exhibiting a uniform base with negligible base recombination and uniform doping, is given by equation 3 below:

$$Irs = Ci*(Tm^x)*e^{(Vg/[kTm/q])} \qquad (3)$$

where:

Ci is a constant for a particular transistor, depending upon geometry and doping densities;

x is a power whose value depends on the mobility of electrons in silicon, reported as having a value from 2 to 4;

Vg is the computed gap voltage for the conduction-valence band separation in silicon (usually 1.21 volts).

Reverse saturation current is known to increase more than 1000:1 over a typical meter's operating range. Since the voltage appearing at the collector of a quasi-diode is:

$$V = kT/q*\ln(I/Irs) \qquad (3a)$$

it can be readily seen that quasi-diode voltage varies substantially with reverse saturation current variations.

Accordingly, it is an object of this invention to provide an improved resistance-sensing meter that employs a logarithmic detector to counteract an exponential characteristic of a sensing resistor.

It is another object of this invention to provide an improved temperature sensing meter that employs a thermistor temperature sensor, the temperature sensing meter including a logarithmic current detector circuit.

It is yet another object of this invention to provide an improved temperature sensing meter that employs a thermistor and logarithmic sensor wherein outputs from the logarithmic sensor are temperature compensated so as to provide accurate temperature readings.

SUMMARY OF THE INVENTION

A meter measures a voltage across a quasi-diode, the voltage caused by a current flowing through a resistance which changes substantially exponentially with changes in a medium being sensed. The meter comprises a logarithmic current measuring circuit coupled to the resistance to provide a measurement output that is a logarithmic function of the current flowing through the sensing resistance. A switchable current source is controlled by a switching circuit to repetitively output first and second current values. A reference logarithmic circuit is connected to the switchable current source and is physically coupled to the logarithmic measuring circuit so as to be maintained at a substantially equal temperature value. The logarithmic reference circuit manifests a first voltage in response to the first current value and a second voltage in response to the second current value, both voltage values dependent upon the temperature of the logarithmic reference circuit. A processor controls the switchable current source to operate at a repetition rate which assures that the first and second current values occur sufficiently rapidly so that the first and second voltages are manifest before the temperature value has had an opportunity to substantially vary. The processor derives from the first voltage, second voltage, and the measuring circuit output, a corrected output that eliminates meter temperature affects.

DETAILED DESCRIPTION OF THE INVENTION

Figure 1:
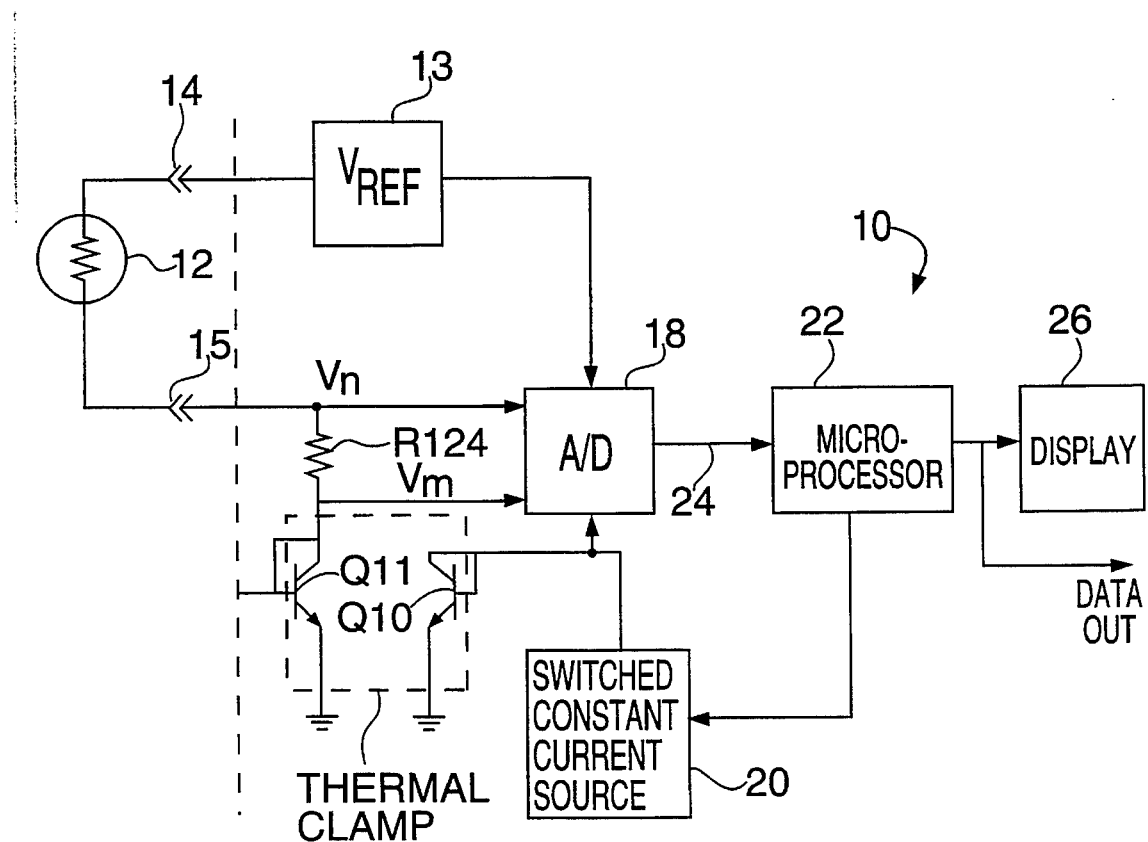
FIG. 1 is a block diagram showing the overall operation of the invention.

Prior to describing the invention, a complete listing of the terms employed herein is as follows:

r=quasi-diode (reference)
m=quasi-diode (measurement)
Vref=reference supply voltage
Rh=Resistance of measurement resistor R124
Re=Resistance of thermistor 12
Tm=Absolute Temp of r&m quasi-diode junctions (°K.)
k=Boltzman's constant $(1,3802 \times 10^{23}$ joules/Kelvin)
q=Charge of an electron $(1,602 \times 10^{-19}$ coulombs)
I=Current flow through thermistor 12
Irs=Reverse bias saturation current of quasi-diode
Rq=Ohmic resistance of quasi-diode
Vg=Gap voltage computed for conduction/valence band separation
Vm=Voltage at measurement quasi-diode/sense resistor junction
Vn=Voltage at thermistor/sense resistor junction
Vf=Voltage with full current applied to reference quasi-diode
Vh=Voltage with half current applied to reference quasi-diode
If=Full current applied to reference quasi-diode
Ih=Half current applied to reference quasi-diode Referring to FIG. 1, meter 10 is coupled to a thermistor 12 via plug connections 14 and 15. An accurate and stable voltage supply 13 (Vref) is connected via plug connection to one side of thermistor 12. The return lead from thermistor 12 is connected by plug connector 15 to a small sensing resistor R124 whose other end is connected to a commonly connected base/collector quasi-diode Q11. Quasidiode Q11 is preferably a high gain NPN transistor whose emitter is tied to the meter's measurement ground. Voltage Vn appearing at the junction between thermistor 12 and resistor R124 is fed to analog-to-digital (A/D) converter 18 as is voltage Vm that appears between resistor R124 and the collector of quasi-diode Q11. An output from reference voltage source 13 is also fed to A/D converter 18 and employs Vref as a scaling voltage.

A second quasi-diode Q10 of the same transistor type as quasi-diode Q11 is driven from a switched constant current source 20. A microprocessor 22 periodically causes constant current source 20 to switch its output current fed to quasi-diode Q10 by a ratio determined by precision resistors within current source 20. The resulting voltage drops across quasi-diode Q10 are fed to A/D converter 18. While not shown in FIG. 1, voltages of Vn, Vm, and the two voltage drop values across reference quasi-diode Q10 are sequentially switched into A/D converter 18 so that digital values corresponding to the respective input analog values may be derived and used by microprocessor 22.

Microprocessor 22 accepts each of the aforesaid inputs and calculates a temperature-corrected value of the voltage at thermistor 12. The calculated value (converted to temperature) may be provided to display 26 and/or as an output data value for further processing.

Quasi-diodes Q11 and Q10 are thermally coupled by clamping the transistor bodies (e.g., plastic-encased TO92 packages) together with a metallic, thermally conductive clamp. The printed wiring connections are also preferably interdigitated and a printed wiring board on which the transistor bodies are mounted is slotted to reduce heat transfer to and from the quasi-diode pair. Addition of insulation is also preferred to assure that quasi-diodes Q11 and Q10 remain at substantially the same temperature.

Meter 10 is initially factory-calibrated by substituting known resistors for thermistor 12 so that the nonlogarithmic (Ohmic) portion of the characteristic of measurement quasi-diode Q11 can be calculated and the ratio r of that resistance to sensing resistance R124 stored in meter 10's nonvolatile memory (within microprocessor 22). Microprocessor 22 can then delete the Ohmic drop from further calculation as follows:

$$\text{Vm,corrected} = \text{Vm,measured} - r*(\text{Vn} - \text{Vm,measured}) \quad (4)$$

As indicated in equations 3 and 3a, the reverse saturation currents of quasi-diodes Q10 and Q11 vary substantially in accordance with temperature. As will be understood, it has been determined that if reference quasi-diode Q10 is rapidly switched between two current levels so as to provide successive different output voltages to A/D converter 18, while the temperature of quasi-diode Q10 remains unchanged, that further calculations can precisely determine the temperature of measurement transistor Q11, thereby enabling a temperature compensation calculation to be performed and an accurate temperature measurement obtained.

The temperature factor of meter 10, i.e., kTm/q, is readily determined from the voltages appearing at the collector of reference quasi-diode Q10 when its current is changed by a known ratio (e.g., 2:1). It is assumed that there is negligible IR drop and self-heating within quasi-diode Q10 so that there is no change in reverse-saturation current when the current therethrough is switched. If it is assumed that switched constant current source 20 provides a full current If and a half current Ih to reference quasi-diode Q10, then voltages Vf and Vh can be determined by equations 5 and 6 as below:

$$Vf = kTm/q \times \ln(If/Irs) \quad (5)$$

$$Vh = kTm/q \times \ln(Ih/Irs) \quad (6)$$

By taking the difference between Vf and Vh, equation 7 results:

$$Vf - Vh = kTm/q \, (\ln[If/Irs] - \ln[Ih/Irs]) \quad (7)$$

Since the difference between two logarithms is the ratio of their factors, equation 7 can be rewritten as equation 8, it being noted that the reverse saturation current Irs cancels out.
Approximately, $$Vf - Vh = kTm/q * (\ln 2) \quad (8)$$

It can be seen that the right side of the equation 8 is known except for Tm. Tm can be calculated from the difference value utilized in further equations shown below. Equation 8 can be rewritten as equation 9:

$$kTm/q = (Vf - Vh)/p \quad (9)$$

where:

p is a predetermined value determined at factory-calibration (e.g., approximately ln(2)).

Because resistors employed in switched constant current source 20 may not provide an exact 1:2 value for the two currents fed to reference quasi-diode Q10, the value of p in equation 9 may be calculated at factory-calibration, using external precision resistors and then stored in nonvolatile memory within microprocessor 22. The ratio of the reverse saturation currents Irs of reference quasi-diode Q10 and measurement quasi-diode Q11 will be Cir/Cim, as determined from equation (3) if the thermal clamping of the devices is effective. The logarithm of this ratio, designated Z, is readily computed at factory-calibration and is also stored in nonvolatile memory within microprocessor 22.

The reverse-saturation current of reference quasi-diode Q10 is then:

$$\ln(Irsr) = \ln(Ih) - Vh/(kTm/q) = \ln(Vref/Rh) - p*Vh/(Vh-Vf) \quad (10)$$

so that the reverse-saturation current of measurement quasi-diode Q11 is:

$$\ln(Irsm) = \ln(Vref) - \ln(Rh) - Z - p*Vh/(Vh-Vf) \quad (11)$$

which is part of the Arrhenius equation.

$$\ln(Im) = \ln(Irsm) + p*Vm/(Vh-Vf) \quad (12)$$

Thus, microprocessor 22 can compute the logarithm of the resistance of thermistor 12 as follows:

$$\ln(Re) = \ln(Vref - Vn) - \ln(Im) = \ln(1 - Vn/Vref) + \ln(Rh) + Z + p*(Vh - Vm)/(Vf - Vh) \quad (13)$$

The value of ln(Rh) may be computed at factory-calibration and stored (with Z) in non-volatile memory within microprocessor 22. For very high thermistor temperature, its resistance is low enough for accurate measurement from the drop across R124, eliminating any high-current nonlinearity and/or temperature disparity in the quasi-diodes.

The above-computed value of the resistance of thermistor 12. (i.e., ln(Re)) diminishes with increased temperature, which value can be subtracted from an arbitrary constant to form an input to a linearizing program. One such linearizing procedure is described in U.S. Pat. No. 5,274,577 to Hinrichs assigned to the same assignee as is this application.

As the result of the above described operation, the large temperature variability of measurement quasi-diode Q11 is thereby eliminated by sensing of a pair of voltages from thermally clamped reference quasi-diode Q10. The widely varying voltage inputs to A/D converter 18 are thus logarithmically controlled to be within the meter's accurate range without a requirement for additional circuit modifications or operator intervention.

Figure 2:
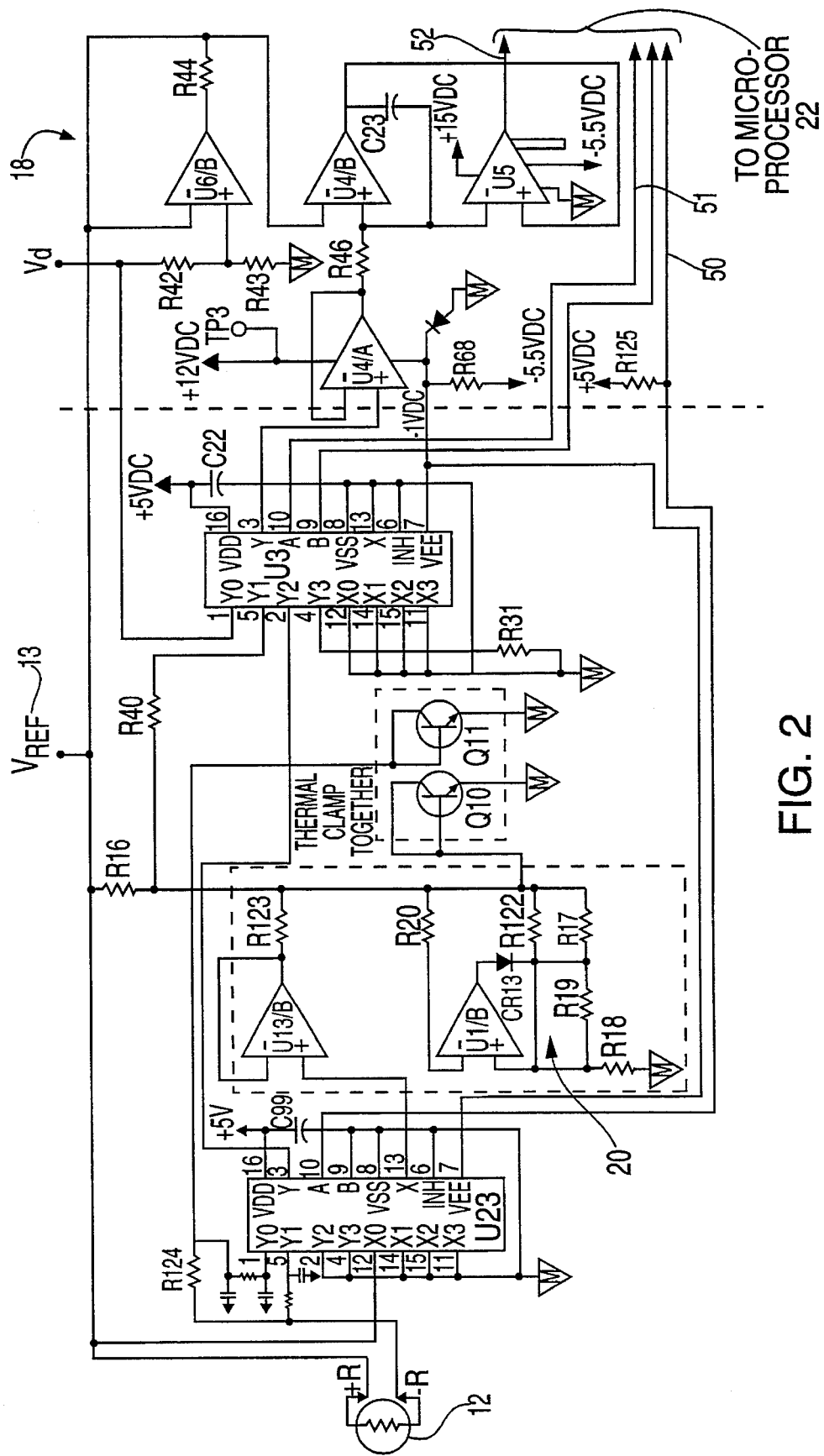
FIG. 2 is a circuit diagram that incorporates the invention hereof.

Turning now to FIG. 2, a detailed circuit illustrates the invention shown in FIG. 1, and further shows details of switched constant current source 20 and switching circuits that enable respective values of Vn, Vm, Vf, and Vh to be fed to microprocessor 22. A primary switching circuit U3 and auxiliary switching circuit U23 selectively enable connection of the aforesaid voltages to A/D converter 18. A/D converter 18 is a dual-slope converter wherein the value of an analog input voltage is determined by the discharge time of capacitor C23 to reach a reference potential. Primary switching circuit U3 and auxiliary switching circuit U23 are identical and enable their Y0 and Y1 inputs to be connected to a Y output and their X0 and X1 inputs to be connected to an X output, respectively.

Switch control inputs to U3 and U23 are applied to the A terminals via lines 50, 51 from microprocessor 22. Switched constant current source 20 comprises a high gain operational amplifier U1/B whose positive input is tied, via resistor R20, to the voltage appearing at quasi-diode Q10. The negative input to operational amplifier U1/B is tied to a midpoint of two equal value resistors R18, R19 which are connected in series to ground from the output of operational amplifier U1/B. This circuit provides operational amplifier U1/B with a gain of almost exactly 2.00. The output of operational amplifier U1/B is connected via parallel resistors R17 and R122 to reference quasi-diode Q10. When the voltage at reference quasi-diode Q10 increases, the current supplied to quasi-diode Q10 from Vref (through R16) and from U13B (through R123) decreases, but U1/B makes up the difference (through R17 and R122) and assures a continued constant current.

The circuit shown for switched constant current source 20 is termed a "Howland pump" and is known in the prior art. The circuit can use operational amplifiers with gains other than two, but it is efficient to use 4 equal resistors (e.g. 10 kilohms each), two to set the gain of operational amplifier U1/B and two to conduct currents to reference quasi-diode Q10.

The current fed to reference quasi diode Q10 is made switchable by adding current from a second voltage source that comprises operational amplifier U13/B (gain equals 1) whose input is alternately connected to ground and Vref from terminal X of switch U23. When operational amplifier U13/B is connected to ground, the quasi diode Q10 current is Ih. When operational amplifier U13/B is connected to Vref from terminal X of switch U25, the current doubles to If.

The operation of the circuit shown in FIG. 2 commences by switch U23 tying X to ground via the X1 terminal causing operational amplifier U13/B to contribute no current to reference quasi-diode Q10. The current through Q10 is thus equal to half value Ih.

Initially, meter 10 measures the ground level by causing switch U3 to connect its Y output to the Y3 input. Thus, the potential applied to A/D converter is ground, which value causes capacitor C23 to obtain a charge that will be stored by the microcontroller as a "zero" value. Next, switch U3 causes output terminal Y to be connected to Y0 (and a stable deintegration voltage Vd) to cause a deintegration of the charge value across capacitor C23. The deintegration time is sensed when the voltage inputs to the operational amplifier become equal, at which time, an output is manifest on line 52. The microcontroller count of the deintegration time is equivalent to the zero-value voltage value stored on capacitor C23.

At this point Vh and Vn are measured in a first half cycle, followed by measurement of Vf and Vm in a second half cycle. The first half cycle commences when switch U3 is caused to connect its output terminal Y to input terminal Y1 so as to enable the feeding of Vh (the voltage of quasi-diode Q10) to A/D converter 18. Subsequently, output Y is connected back to input Y0 and a deintegration again occurs enabling a measurement of Vh to be sent to microprocessor 22. Next, output Y of switch U3 is connected to its input terminal Y2 enabling Vn (the voltage at the Y output of switch U23) to be fed to A/D converter 18. Subsequently, input Y0 is connected to output Y of switch U3 and deintegration again occurs enabling the value of Vn to be fed to microprocessor 22. It is to be remembered that during the first half cycle output Y of auxiliary switch U23 is connected to input Y1, thereby causing Vn to be fed from resistor R124 to input Y2 of switch U3. Output X of switch U23 is connected to input X1, creating current Ih in Q11.

A second half cycle now measures Vf and Vm. The ground measurement step, mentioned above, is not performed during this second cycle. Switch U23 is initially operated to tie its output Y to the Y0 input. In addition, the X output of auxiliary switch U23 is connected to the X0 input thereby allowing Vref to be applied to an input to buffer amplifier U13/B. As a result, the current applied to reference quasi-diode Q10 is doubled.

Switch U3 is then operated to connect its output Y to input Y1 which causes Vf to be applied to A/D converter 18. After an appropriate charging time, output Y of switch U3 is connected back to Y0, allowing deintegration to occur and a measurement of Vf to be sent to microprocessor 22. Finally, the Y output of primary switch U3 is connected to input Y2 which has impressed thereon Vm through switch U23. thereafter, the Y output of switch U3 is switched back to input Y0, allowing deintegration to occur and a measurement of Vm to be passed to microprocessor 22.

As above described, microprocessor 22 is now able, having values of Vh, Vn, Vf, and Vm, to calculate the resistance of thermistor 12 without concern as to temperature variations of the reverse saturation current of transistor Q11.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

We claim:

1. A meter for measuring a voltage at a resistance that responds to changes in a medium being sensed by exhibiting substantially exponential resistance changes, said meter comprising:

measuring logarithmic means coupled to said resistance for providing a measurement output that is a substantially logarithmic function of said voltage at said resistance, accuracy of said measurement output dependent upon a temperature value of said measuring logarithmic means;

a switchable current source;

switch means for causing said switchable current source to repetitively output first and second current values;

reference logarithmic means connected to said switchable current source and physically coupled to said measuring logarithmic means so as to be maintained at a substantially same temperature value as said measuring logarithmic means, said reference logarithmic means manifesting a first voltage in response to said first current value and a second voltage in response to said second current value, said first and second voltages dependent upon said same temperature value;

processor means for controlling said switch means to operate at a repetition rate which assures that a said first voltage and a said second voltage are manifest before said same temperature value has an opportunity to substantially vary, said processor means deriving from said first voltage, said second voltage and said measurement output a corrected measurement output, that takes into account said same temperature value.

2. The meter as recited in claim 1 wherein said reference logarithmic means comprises:

a bipolar transistor having collector and base electrodes connected to each other so as to create a reference quasi-diode.

3. The meter as recited in claim 2 wherein said measuring logarithmic means comprises:

a measurement resistor; and a bipolar transistor having collector and base electrodes connected to each other so as to create a measuring quasi-diode.

4. The meter as recited in claim 3 wherein said reference quasi-diode and measuring quasi-diode are packaged in a thermally intimate fashion so as to substantially assure temperature value equality therebetween.

5. The meter as recited in claim 4 wherein said switchable current source produces substantially constant currents at said first current value and said second current value.

6. A meter for measuring a voltage of a thermistor whose resistance changes substantially exponentially with changes in temperature, said meter comprising:

a voltage supply connected to a first terminal of said thermistor;

a sense resistor connected to a second terminal of said thermistor;

measuring diode means having first and second terminals, said first terminal coupled to said sense resistor and said second terminal connected to a source of common potential;

reference diode means having first and second terminals, said second terminal connected to said source of common potential, both said measuring diode means and references diode means thermally clamped to each other;

a constant current source connected to said first terminal of said reference diode means, said constant current source controllable to supply at least first and second levels of constant current to said reference diode means;

first switch means connected to said constant current source and controlling said constant current source to supply either said first level of constant current or said second level of constant current;

analog to digital converter means;

second switch means coupled to said sense resistor and said reference diode means for supplying a sequence of voltages to said analog to digital converter means, including (i) Vf corresponding to a potential at said first terminal of said reference diode means when said constant current source supplies said first level of constant current (ii) Vh corresponding to a potential at said first terminal of said reference diode means when said constant current source supplies said second level of constant current (iii) Vn corresponding to a potential at a connection between said thermistor and said sense resistor, and (iv) Vm corresponding to a potential at a connection between said sense resistor and said measuring diode means; and a processor connected to an output from said analog to digital converter means and coupled to said first and second switch means, for controlling operation of said first and second switch means and for calculating a temperature based upon said values of Vf, Vh, Vn, and Vm.

7. The meter as recited in claim 6 wherein the said processor calculates the logarithm of the value of the resistance of said thermistor as follows:

$$\ln(Re)=\ln(1-Vn/Vref)+\ln(Rh)+Z+p*(Vh-Vm)/Vf-Vh)$$

where:

Re=resistance value of thermistor

Vref=voltage supply value

Rh=sense resistor value

Z=log of ratio of reverse saturation currents of the measuring and reference diode means p=log of constant-current ratio of measuring and reference diode means k=Boltzmann's constant;

q=charge of an electron ($1.602 \times 10^{-19}$ coulombs).

* * * * *